United States Patent [19]

Hakhverdian

[11] Patent Number: 4,712,107
[45] Date of Patent: Dec. 8, 1987

[54] CAPACITIVE DISPLACEMENT TRANSDUCER FOR GENERATING ELECTRICAL SIGNALS CORRESPONDING TO SINGLE-VALUED FUNCTIONS

[76] Inventor: Armik A. Hakhverdian, 1153 Janis Way, San Jose, Calif. 95125

[21] Appl. No.: 697,839

[22] Filed: Feb. 4, 1985

[51] Int. Cl.$^4$ ............................................. G01R 27/26
[52] U.S. Cl. ............................ 340/870.37; 324/60 C; 324/61 R; 324/61 P
[58] Field of Search .................. 340/870.37, 870.16; 310/111; 324/DIG. 1, 60 C, 60 R, 61 R, 61 P; 364/860, 518; 178/18, 19, 20, 17 D

[56] References Cited

U.S. PATENT DOCUMENTS

| | | | |
|---|---|---|---|
| 3,329,804 | 7/1967 | Anderson et al. | 364/860 |
| 3,348,133 | 10/1967 | Wolfendale | 340/870.37 |
| 3,784,897 | 1/1974 | Norrie | 340/870.37 |
| 4,300,093 | 11/1981 | Ogasawara et al. | 340/870.37 |
| 4,310,806 | 1/1982 | Ogasawara | 340/870.37 |
| 4,364,046 | 12/1982 | Ogasawara et al. | 340/870.37 |
| 4,410,852 | 10/1983 | Guretzky | 340/870.37 |
| 4,434,391 | 2/1984 | Swartz et al. | 340/870.37 |
| 4,476,540 | 10/1984 | Corral | 364/860 |

FOREIGN PATENT DOCUMENTS 1047600  11/1966  United Kingdom ........... 340/870.37

Primary Examiner—John W. Caldwell, Sr.
Assistant Examiner—Alvin Oberley
Attorney, Agent, or Firm—Wenderoth, Lind & Ponack

[57] ABSTRACT

A thin conducting probe is held parallel to and at a close distance from a conducting plate which depicts a given single-valued elementary function f(x). The electrical capacitance formed between the probe and the plate at a point within the interval specifying the validity of the function is made proportional to the value of the function f(x) at that point. As a linear capacitive displacement transducer, a rectangular inclining plate is moved in front of a fixed probe. The capacitance between the probe and the plate is measured by a bridge and a corresponding reading displayed. The displayed reading is directly related to the distance covered by the plate.

9 Claims, 8 Drawing Figures

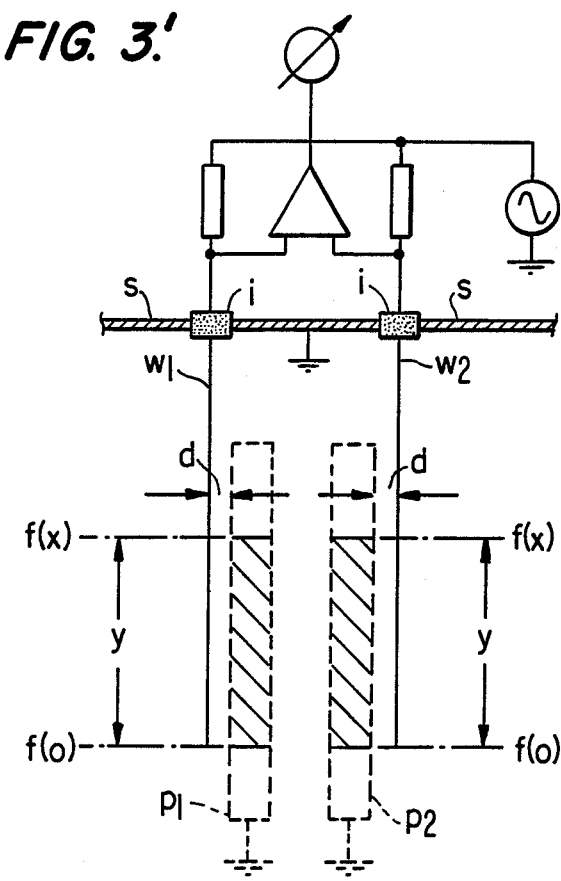
FIG. 3.'
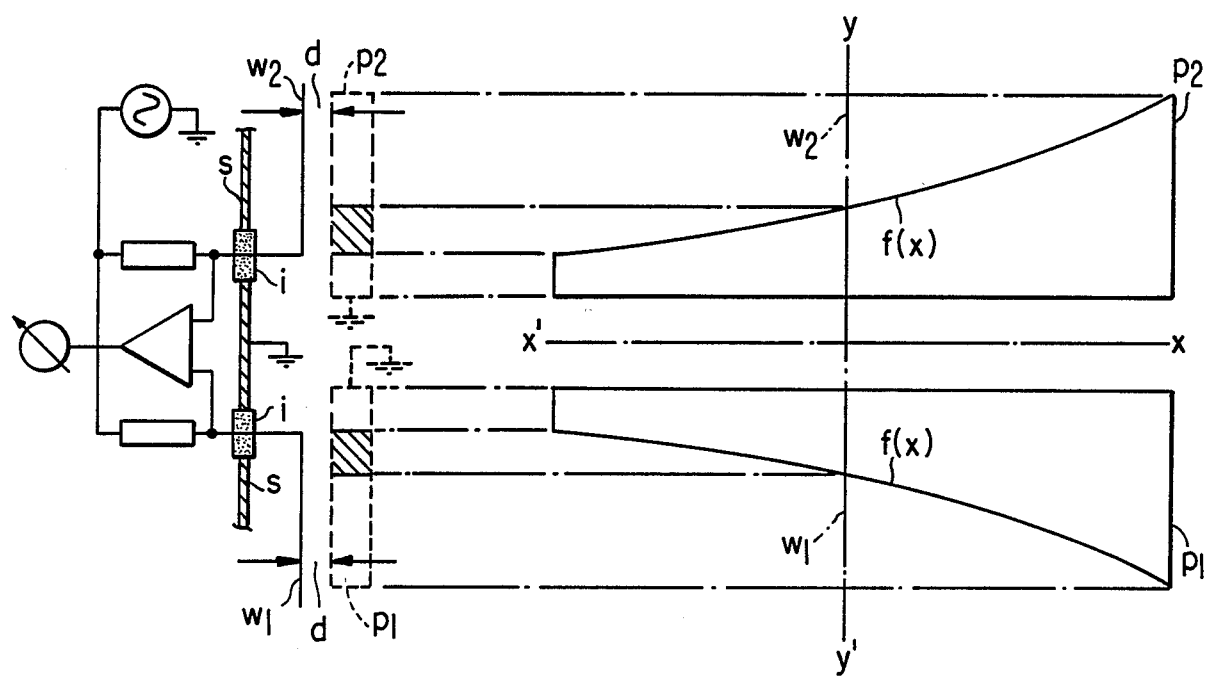
FIG. 4.'

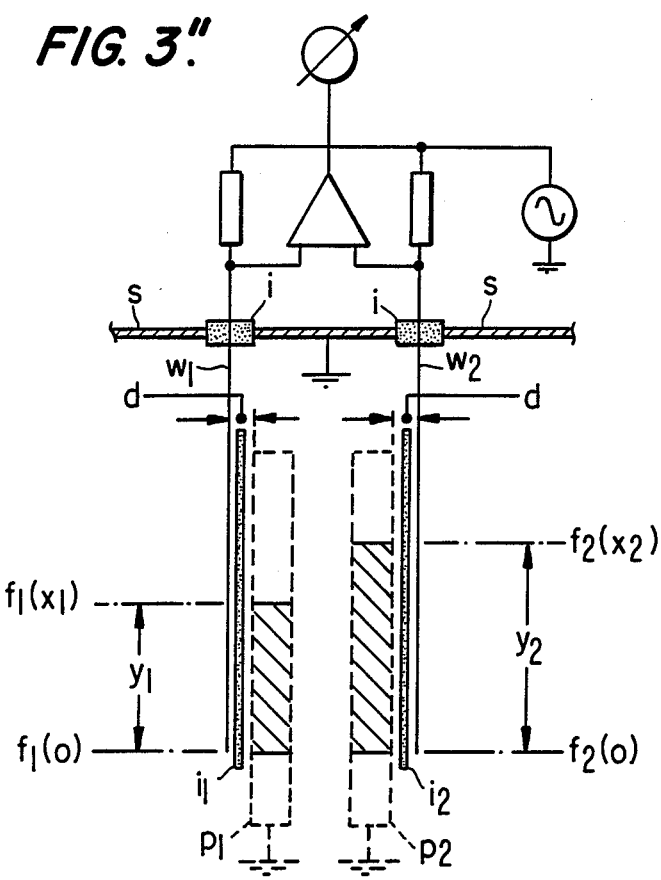
FIG. 3."
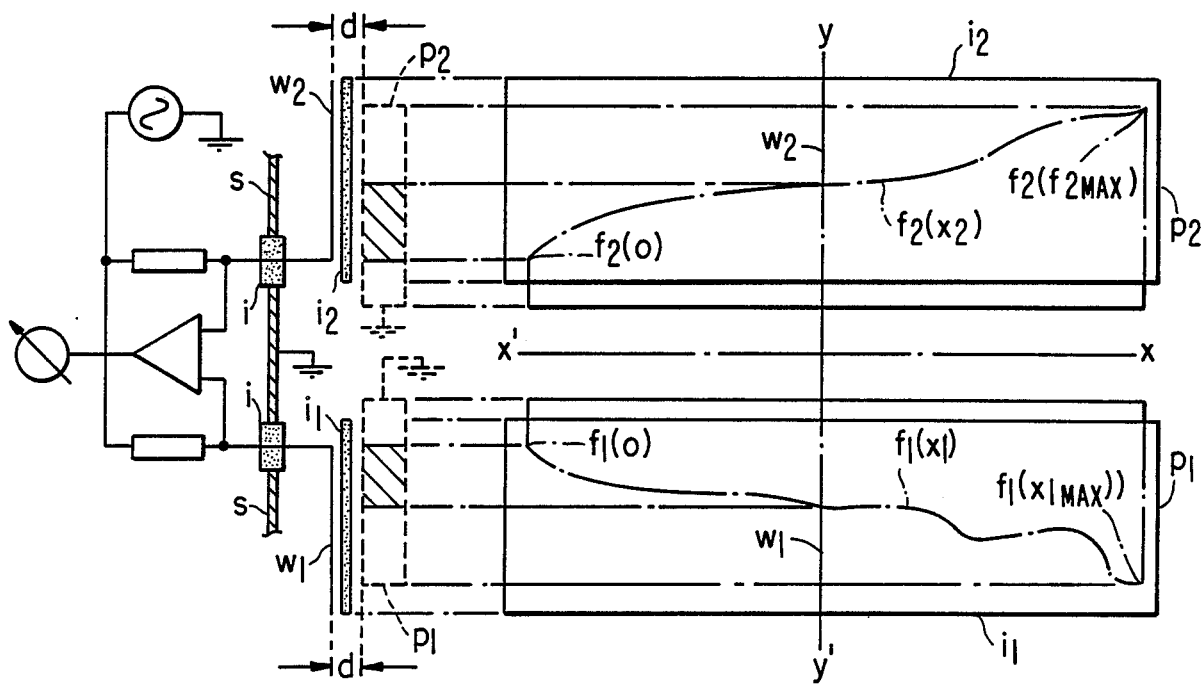
FIG. 4."

CAPACITIVE DISPLACEMENT TRANSDUCER FOR GENERATING ELECTRICAL SIGNALS CORRESPONDING TO SINGLE-VALUED FUNCTIONS

BACKGROUND OF THE INVENTION

The present invention is directed to an apparatus for generating electrical signals corresponding to singlevalued functions. More particularly, the invention is directed toward a capacitive displacement transducer for generating such electrical signals by moving a function plate having a single-valued function depicted on one edge thereof past a capacitive probe such that the capacity between the probe and function plate is proportional to the desired function.

SUMMARY OF THE INVENTION

The object of the invention is to provide a capacitive displacement transducer for generating electrical signals corresponding to single-valued functions. A function plate has the desired function depicted along one edge thereof and the function plate is then moved by a capacitive probe such that the capacitance between the probe and the function plate is proportional to the desired function. A capacitance measuring device measures the capacitance between the probe and function plate and produces an electrical signal corresponding to the measured capacitance. This electrical signal is thereby proportional to the desired function.

Another object of the invention is to provide a pair of capacitor probe/function-plate arrangements connected to a signal capacitance measuring device so as to produce a signal proportional to the difference between the function depicted on one of the two function plates and that depicted on the other of the two function plates.

The object may be still further obtained by providing the apparatus as noted above, wherein the function plate or plates are arranged as right cylinders.

BRIEF DESCRIPTION OF THE DRAWINGS

FIGS. 2-6 respectively illustrate second through sixth embodiments of the present invention and FIGS. 1'-4' and 3" and 4" respectively illustrate variations of the embodiments illustrated in FIGS. 1-4 and 3 and 4.

DESCRIPTION OF THE PREFERRED EMBODIMENTS

Figure 1:
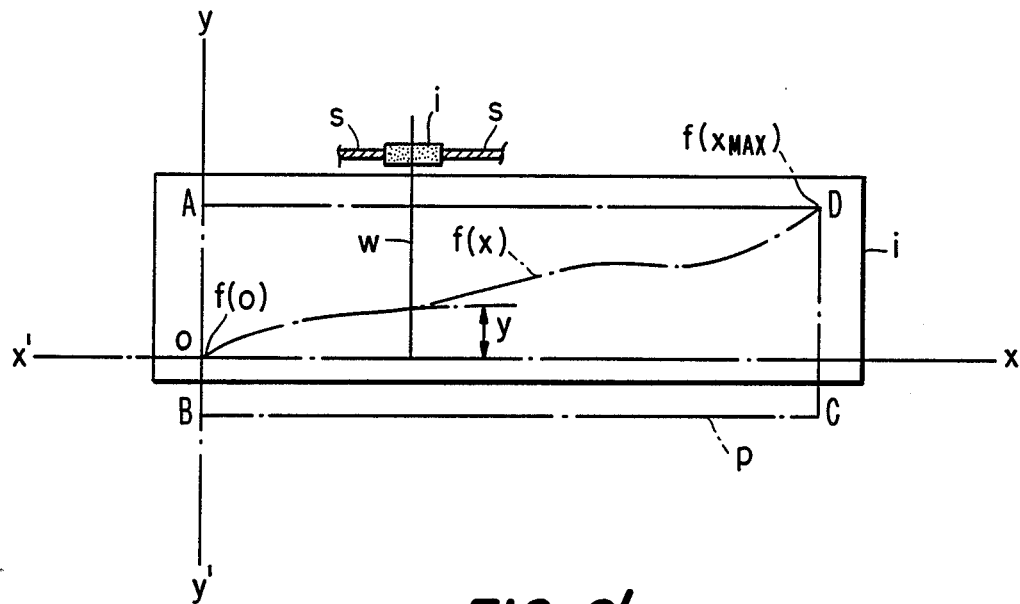
FIG. 1 illustrates one embodiment of the present invention.

The top section of a metal plate ABCD is cut away in such a way as to render the resulting contour OD a desired singlevalued elementary function f(x) in the rectangular coordinates shown in FIG. 1.

The plate OBCD (also called function-plate hereinafter) is rigidly mounted on a carriage not shown in FIG. 1. The carriage and plate OBCD can be moved horizontally along the xx' axis in the plane of the paper.

A thin wire probe w, which is electrically insulated from its supporting structure S by means of insulator I, is located at a short distance d from plate OBCD. The probe is parallel to the function-plate, perpendicular to xx' axis and fixed in position.

The lower end of probe w reaches f(x), its upper end extending slightly beyond $f(x_{max})$ A section y of the probe w directly opposite plate OBCD denotes the value of f(x) at that point. Thus, when the plate OBCD is moved towards the left, the length of y approaches $f(x_{max})$, and when the plate OBCD is moved towards right, the length of y approaches f(0).

Figure 2:
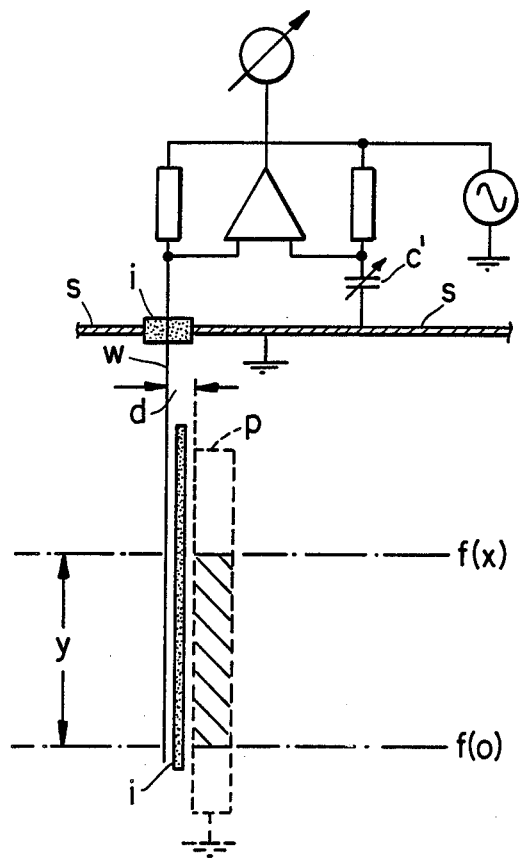

FIG. 2, not to scale, shows sectionally the arrangement shown in FIG. 1 viewed from right-hand-side. The dotted rectangle p is the side-view of the function-plate and its shaded area corresponds to the section y of probe w.

The probe w, being electrically insulated from its surroundings, constitutes a capacitor whose value in farads can be expressed by;

$$C = C_o + kf(x)$$

where:

$C_o$ is the total stray capacitances (in farads) associated with the probe and surroundings, and is invariant for a given construction; and kf(x) is a capacitance due to a uniform electric field in the narrow gap d, between probe w and function-plate OBCD.

It depends on the height y (FIG. 2) and hence is directly proportional to f(x) which in turn denotes the position of the plate OBCD along xx' axis. The constant of proportionality k is invariant for any one construction and depends on the distance between the probe and the function-plate, the diameter of probe, the permittivity of space and the relative permittivity of any substance which might occupy the gap d. Here the relative permittivity is that of a vacuum.

A capacitance measuring bridge shown symbolically above SS in FIG. 2 translates the horizontal position of the plate OBCD into an output voltage or current either in analogue or digital form. This bridge corresponds to that discussed in detail in my U.S. Pat. No. 4,446,423 and accordingly, a detailed description thereof has been omitted for the sake of brevity.

The mechanism (not shown) carrying the plate OBCD is first placed at f(0) and then trimmer C' is adjusted for a zero output. Thereafter, the bridge output in volts is simply;

$$V_o = Qf(x) \text{ volts.}$$

where Q is a system constant.

In a symmetrical version of the embodiment whose description follows, the balancing trimmer C' shown in FIG. 2 is replaced by an additional section comprising a second functionplate and its companion probe. The carriages and hence their respective function-plates can be positioned anywhere along their common axis xx' independently.

FIG. 3 shows sectionally one such arrangement where the function-plate $p_1$ together with its associated probe $w_1$ form a capacitance $C(w_1p_1)$ which is proportional to $f_1(x_1)$ at $x_1$ and in a similar manner the function-plate $p_2$ together with its associated probe $w_2$ form another capacitance $C(w_2p_2)$ which is proportional to $f_2(x_2)$ at $x_2$.

These capacitances constitute the lower two arms of the measuring AC bridge shown symbolically in FIG. 3.

Assuming equal stray capacitances for both sections, then;

$$V_o = Q[C(w_1p_1) - C(w_2p_2)]$$

-continued $$= Q[C_o + kf_1(x_1) - C_o - kf_2(x_2)]$$

$$= Qk[f_1(x_1) - f_2(x_2)] \text{ volts (say)}.$$

For identical function-plates f(x), the above reduces to;

$$V_o = Qkf(x_1 - x_2) \text{ volts}.$$

Where Q and k are constants defined earlier.

In an alternative construction, function-plates $p_1$ and $p_2$ operate in one plane as outlines in FIG. 4. Here probes $w_1$ and $w_2$ are bent outwards so as to lie in a plane parallel to the functionplates. As in the previous case, probes $w_1$ and $w_2$ are located at a distance d from their respective function plates $p_1$ and $p_2$. The function-plates as stated earlier are free to move in the plane of the paper along their common horizontal axis xx'.

The results of the previous case in connection with FIG. 3 are also valid here, and so the AC bridge output in volts is given by;

$$V_o = Qk\{f_1(x_1) - f_2(x_2)\} \text{ volts}$$

Figure 5:
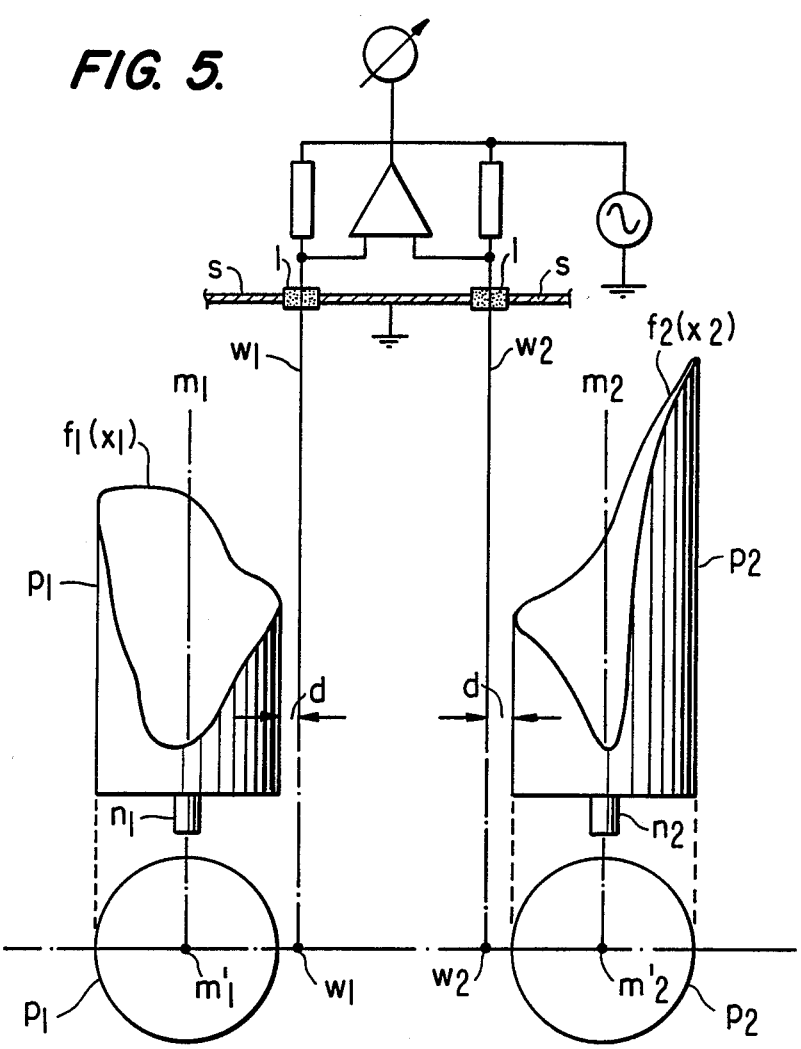

FIG. 5 shows an angular-displacement equivalent of the arrangement outlined in FIG. 2. The function-plates $p_1$ and $p_2$ are rolled into cylinders $P_1$ and $P_2$ and positioned at a distance d from their respective probes $w_1$ and $w_2$, such that the centers of said cylinders and said probes lie on a straight line perpendicular to the xx' axis as shown in the lower part of FIG. 5. Cylinders $P_1$ and $P_2$ can be rotated independently by means of their respective shafts $n_1$ and $n_2$ about their axes $m_1m_1'$ and $m_2m_2'$. The axes are parallel to the probes and fixed in position.

The translational displacements $x_1$ and $x_2$ described in the previous two cases are replaced by their equivalent angular displacements $\theta_1$ and $\theta_2$ respectivley.

Hence, $V_o = Qk\{f_1(\theta_1) - f_2(\theta_2)\}$ volts.

The displacement $\theta$ varies from 0 degrees corresponding to f(0) to 360 degrees corresponding to $f(x_{max})$.

In another approach, the function-plate p is shaped to depict the function f(x) in polar form. The function-plate can be rotated in its plane about its pole.

Figure 6:
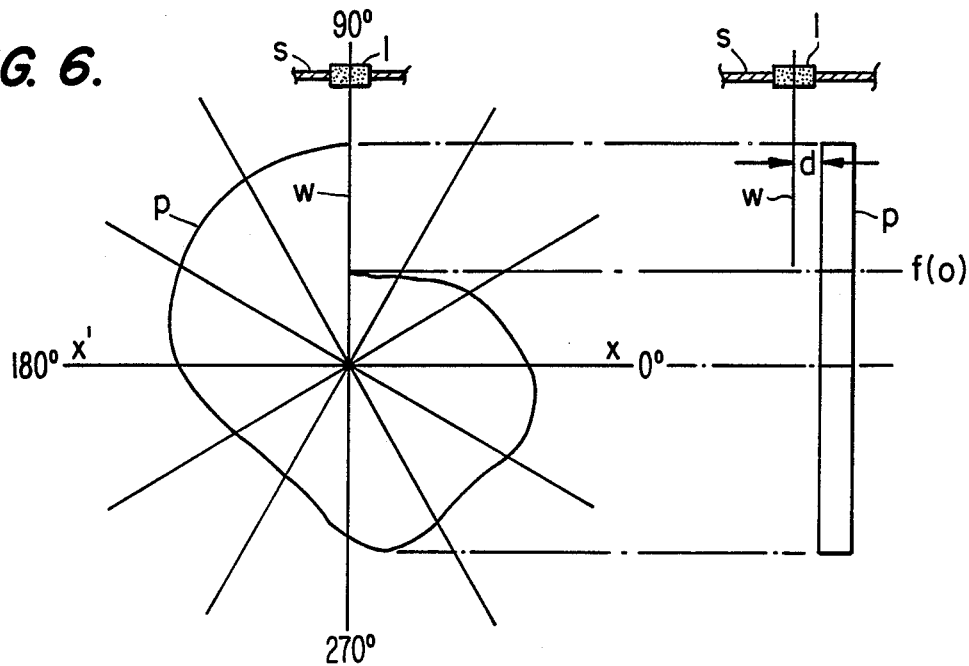

FIG. 6 shows partially the above arrangement where the probe w, insulated from its supporting structure S by an insulator I, is placed at a distance d from the function-plate p. The probe is parallel to the function-plate, perpendicular to the polar axis xx' and is fixed in position. The total capacitance associated with the probe w is once again;

$$C = C_o + kf(\theta) \text{ farads. where the independent}$$
variable $\theta$ replaces the variable x dealt with earlier.

In a symmetrical arrangement (not shown) similar to what has already been discussed earlier in connection with FIG. 3, the function-plates $p_1$ and $p_2$ depicting functions $f_1(\theta_1)$ and $f_2(\theta_2)$ in polar coordinates can be positioned at any desired angle independent of one-another. The function-plates together with their companion probes $w_1$ and $w_2$ form capacitances $C(w_1p_1)$ and $C(w_2p_2)$ which are proportional to $f_1(\theta_1)$ at $\theta_1$ and $f_2(\theta_2)$ at $\theta_2$ respectively. These capaciatnces constitute the lower two arms of a measuring AC bridge.

Once again the output of the said bridge is given by;

$$V_o = Qk\{f_1(\theta_1) - f_2(\theta_2)\} \text{ volts}$$

FIGS. 1' and 2' respectively correspond to FIGS. 1 and 2 with the addition of a non-conducting material i having a permittivity greater than that of a vacuum and arranged between the probe and function plate.

FIGS. 3' and 4' respectively correspond to FIGS. 3 and 4 for the case where the first and second function-plates are connected such that $x_1$ equals $x_2$ and so that $f_1(x_1)$ equals minus $f_2(x_2)$.

FIGS. 3'' and 4'' respectively correspond to FIGS. 3 and 4 for the case wherein a pair of sheets of non-conducting material $i_1$ and $i_2$ having a permittivity greater than that of a vacuum are respectively arranged between the first probe and the first function plate and between the second probe and the second function plate.

What is claimed is:

1. An apparatus for converting a single-valued elementary function $f_1(x_1)$ into a corresponding electrical signal at any point $x_1$ within a predetermined interval in which the function $f_1(x_1)$ is defined, comprising:

a function-plate having one edge corresponding to a graph of said function $f_1(x_1)$, said plate being rigidly mounted on a moveable carriage arranged so as to be moveable in a direction parallel to the abscissa of said graph of said function $f_1(x_1)$;

a fixedly mounted thin conductive probe arranged adjacent said one edge of said plate, said probe being electrically insulated from and spaced parallel to said plate arranged perpendicular to the direction of movement of said plate;

a capacitance measuring device connected to said probe for converting the measured electrical capacitance between said probe and said plate into an electrical signal output; wherein said measured capacitance between said probe and said plate at any one point $x_1$ within said interval is proportional to the value of said graph at said one point $x_1$ and wherein said electrical signal output thereby corresponds to the value of said function $f_1(x_1)$ at said point $x_1$.

2. An apparatus for converting a pair of single-valued elementary functions $f_1(x_1)$ and $f_2(x_2)$ into a pair of respective corresponding electrical signals at any respective points $x_1$ and $x_2$ within respective predetermined intervals in which the respective functions $f_1(x_1)$ and $f_2(x_2)$ are defined, comprising:

a first function-plate having one edge corresponding to a graph of said function $f_1(x_1)$ said first plate being rigidly mounted on a first moveable carriage arranged so as to be moveable in a direction parallel to the abscissa of said graph of said function $f_1(x_1)$;

a second function-plate having one edge corresponding to a graph of said function $f_2(x_2)$, said second plate being rigidly mounted on a second moveable carriage arranged so as to be moveable in a direction parallel to the abscissa of said graph of said function $f_2(x_2)$;

a first fixedly mounted thin conductive probe arranged adjacent said one edge of said first plate, said first probe being electrically insulated from and spaced parallel to said first plate and arranged perpendicular to the direction of movement of said first plate;

a second fixedly mounted thin conductive probe arranged adjacent said one edge of said second plate, said second probe being electrically insulated from said second plate and arranged parallel to the direction of movement of said second plate;

a capacitance measuring device connected to said first and second probes and plates and arranged such that a measured capacitance between said first probe and said first plate at any one point $x_1$ within said respective interval is proportional to the value of said respective graph at said one point $x_1$ and a measured capacitance between said second probe and said second plate at any one point $x_2$ within said respective interval is proportional to the value of said respective graph at said one point $x_2$ and wherein said capacitance measuring device provides an electrical output signal which is proportional to the algebraic diference between said two measured capacitances so as to thereby correspond the difference between the values of functions $f_1(x_1)$ and $f_2(x_2)$.

3. An apparatus as recited in claim 2, wherein said first and second function-plates are operatively connected so that $x_1 = x_2$ and arranged so that $f_1(x_1) = -f_2(x_2)$, whereby said output of said capacitance measuring device corresponds to 2 $f_1(x_1) = 2 f_2(x_2)$.

4. An apparatus as recited in claim 1, wherein said function-plate comprises a right cylinder.

5. An apparatus as recited in claim 2, wherein said function-plates each comprise right cylinders.

6. An apparatus as recited in claim 4, wherein said interval is selected such that when said function $f_1(x)$ is periodic, said interval comprises one cycle of said function $f_1(x_1)$.

7. An apparatus as recited in claim 1, wherein a sheet of non-conducting material having a permittivity greater than that of a vacuum is arranged between said probe and said function plate.

8. An apparatus as recited in claim 2, wherein a pair of sheets of non-conducting material having a permittivity greater than that of a vacuum are respectively arranged between said first probe and first function-plate and between said second probe and second function plate.

9. An apparatus as recited in claim 2, wherein said pair of function-plates are arranged to depict their corresponding functions in polar form and are arranged to be moved by their respective carriages about their respective polar origins.

* * * * *